United States Patent [19]
Chiang et al.

[11] Patent Number: 5,506,523
[45] Date of Patent: Apr. 9, 1996

[54] SENSE CIRCUIT WITH SELECTABLE ZERO POWER SINGLE INPUT FUNCTION MODE

[75] Inventors: David Chiang, Saratoga; Nicholas Kucharewski, Jr., Pleasanton, both of Calif.

[73] Assignee: XILINX, Inc., San Jose, Calif.

[21] Appl. No.: 204,717

[22] Filed: Mar. 1, 1994

[51] Int. Cl.⁶ .................................................. G11C 7/00
[52] U.S. Cl. ............................................................ 327/57
[58] Field of Search .................................. 327/50, 51–57, 327/199; 365/205

[56] References Cited

U.S. PATENT DOCUMENTS

| | | | |
|---|---|---|---|
| 4,504,929 | 3/1985 | Takemae et al. | 327/55 |
| 4,855,628 | 8/1989 | Jun | 327/57 |
| 4,931,992 | 6/1990 | Ogihara et al. | 365/205 |
| 4,947,376 | 8/1990 | Arimoto et al. | 327/51 |

*Primary Examiner*—Toan Tran
*Attorney, Agent, or Firm*—Jeanette S. Harms

[57] ABSTRACT

The present invention provides a sense circuit including a first bit line, a second bit line, a first plurality of memory cells coupled to the first bit line, a second plurality of memory cells coupled to the second bit line, and selection circuitry coupled to the first bit line and the second bit line. The selection circuitry provides a wide AND gate function in one mode and provides a zero power circuit for generating a function of a single input in another mode.

13 Claims, 2 Drawing Sheets

SENSE CIRCUIT WITH SELECTABLE ZERO POWER SINGLE INPUT FUNCTION MODE

BACKGROUND OF THE INVENTION

1. Field of the Invention

The present invention relates to a programmable logic device, and in particular to a sense circuit having a wide AND gate mode or a zero power single input function mode.

2. Description of the Related Art

FIG. 1 illustrates a conventional programmable logic device (PLD) sensing circuit 100 having a plurality of memory cells 107, 108, 113, and 114 to provide a wide AND gate functionality. Typically, sensing circuit 100 uses either electrically programmable read only memories (EPROMs) or electrically erasable programmable read only memories (EEPROMs) for memory cells 107, 108, 113, and 114.

An EPROM includes a floating gate FG, a control gate CG, a source S and a drain D (see memory cell 107 for reference). Floating gate FG is isolated from control gate CG by an insulating material. To program an EPROM, i.e. to store a zero at this memory cell, a high voltage is applied to control gate CG and drain D and a low voltage is applied to source S, thereby causing electrons to flow from source S to drain D of the EPROM. If this current is sufficiently large, a small number of electrons attain sufficient energy to traverse the insulating layer between the channel and floating gate FG, thereby resulting in a negative charge accumulation on floating gate FG. After the high voltage is removed, this negative charge remains on floating gate FG which increases the threshold voltage of the EPROM. Thus, during subsequent read operations, a fully programmed EPROM will not turn on even if it is selected. An EPROM is erased by exposing the cell to ultraviolet light, thereby providing sufficient energy for the trapped charge to escape. An EEPROM, which is similar in configuration to an EPROM, is erased electrically by applying a low voltage to floating gate FG and source S and applying a high voltage to drain D.

As shown in FIG. 1, signals A and B are provided to input lines 101 and 102, respectively. Signal A is inverted by inverter 103 and then provided to the control gate of memory cell 107 via line 104. The complement of signal A, signal $\overline{A}$ is inverted by inverter 105 and then provided to the control gate of memory cell 108 via line 106. In a similar manner, signal B is inverted by inverter 109 and then provided to the control gate of memory cell 113 via line 110, and the complement of signal B, signal $\overline{B}$, is inverted by inverter 111 and then provided to the control gate of memory cell 114 via line 112. Each of memory cells 107, 108, 113, and 114 is coupled between a low voltage source (typically ground) and a bit line 120.

Sensing circuit 100 includes a p-type transistor 116 having its drain D and its gate G connected at node 115. The source S of transistor 116 is coupled to a high voltage source Vcc. In this configuration, transistor 116 provides a pull-up of the voltage at node 115. Typically, transistor 116 is sized to provide a weak voltage pull-up. Node 115 is coupled to the drain D of n-type transistor 121, whereas the source S of transistor 121 is coupled to bit line 120. Gate G of transistor 121 receives a reference voltage Vref which is typically 2.7 volts, thereby turning on transistor 121. Transistor 121 limits the voltage swing on bit line 120 to between approximately zero volts and 1.8 volts. The voltage at node 115 is amplified by inverters 117 and 118 to provide a full CMOS level output signal Y on output line 119.

In this configuration, if any one of the memory cells 107, 108, 113, or 114 is unprogrammed and is subsequently selected (i.e. provided with a high voltage on its control gate CG), that unprogrammed cell turns on, thereby providing a strong pull-down of the voltage on bit line 120 and node 115 (via transistor 121) and overpowering the weak pull-up provided by transistor 116. In this manner, a wide-fanin AND function is provided. For example, if sense circuit 100 is used to implement the function $Y=A \cdot \overline{B}$, memory cells 107 and 114 are left unprogrammed while all other memory cells on bit line 120 are programmed.

Wider fanin logic functions are implemented by increasing the number of memory cells on bit line 120. Specifically, a sense circuit that provides a fanin of N input lines (wherein N is an integer) requires 2N memory cells coupled to its bit line, i.e. each memory cell having a control gate coupled to either the true or complement polarity of the signals on the N input lines.

In this configuration, a continuous DC current is drawn as long as the voltage on bit line 120 is pulled low by one or more unprogrammed, selected memory cells coupled to bit line 120. However, not all applications require a sense circuit having a wide fan-in functionality. In fact, many applications require only a simple input/output connection. In those applications, the continuous DC current in sensing circuit 100 results in a significant power draw. Therefore, a need arises for a sense circuit that selectively provides a wide fan-in functionality in one mode and a zero power single connection in another mode.

SUMMARY OF THE INVENTION

In accordance with the present invention, a sense circuit includes a first bit line, a second bit line, and selection circuitry coupled to the first bit line and the second bit line. The selection circuitry allows a wide AND gate function in one mode and a zero power single input function in another mode. The present invention further includes a plurality of memory devices. These memory devices are either coupled between the first bit line and a low voltage source, or coupled between the second bit line and the low voltage source. A first set of the plurality of memory cells receive input signals to the sense circuit as control gate signals, wherein a second set of the plurality of memory cells receive the complement of the input signals to the sense circuit as control gate signals.

In one embodiment, the selection circuitry includes first and second transistors cross-coupled between the first and second bit lines, i.e. the gate of the first transistor is coupled to the second bit line, whereas the gate of the second transistor is coupled to the first bit line. The first transistor is further coupled to a high voltage source, whereas the second transistor is further coupled to a means for providing either a high voltage or a low voltage as determined by a mode select signal provided on an enable line. In one embodiment, the means for providing includes a signal line coupled between a third transistor and a fourth transistor, wherein the third transistor is coupled to the high voltage source and the fourth transistor is coupled to the low voltage source. The third and fourth transistors are activated by signals on the enable line.

In the wide AND gate mode, a high signal is provided on the enable line. This high signal turns off the third transistor and turns on the fourth transistor, thereby providing a low voltage on the signal line. In accordance with the present invention in the wide AND gate function mode, all of the memory cells coupled to the second bit line are left in an unprogrammed state. Thus, irrespective of the input signals provided to the sense circuit, half of the memory cells on the second bit line are always on, thereby also pulling the voltage on the second bit line low.

Because of the cross-coupled configuration of the first and second transistors, the low voltage on the second bit line is provided to the gate of the first transistor, thereby turning on this transistor. The first transistor is sized to provide a weak pull-up in the sense circuit. Thus, any selected, unprogrammed memory cell on the first bit line pulls down the voltage on this bit line. Therefore, in accordance with the present invention, the memory cells coupled to the first bit line provide the wide AND gate functionality of a conventional sense circuit.

In the zero power single input function mode, a low signal on the enable line turns off the fourth transistor and turns on the third transistor, thereby providing a high voltage on the signal line. In accordance with the present invention in this mode, only one memory cell per bit line is left unprogrammed and all other memory cells in the sense circuit are programmed (disabled). For example, in one embodiment, the memory cell on the first bit line which is controlled by the inverted polarity of the input signal is left unprogrammed and the memory cell on the second bit line which is controlled by the true polarity of the input signal is also left unprogrammed. In another embodiment, the memory cell on the first bit line which is controlled by the true polarity of the input signal is left unprogrammed and the memory cell on the second bit line which is controlled by the inverted polarity of the input signal is also left unprogrammed.

The configuration of the present invention in the zero power single input function mode ensures that only one of the first and second transistors is on, thereby providing the appropriate signal on the output line of the sense circuit. Moreover, the bit line coupled to the on transistor has no memory cells turned on, therefore no DC current is drawn through those memory cells. Furthermore, because the other transistor is turned off, no DC current is drawn through this device either. Thus, the present invention provides a mode in which power consumption is significantly reduced in comparison to prior art sense circuits which require a continuous DC current draw.

DETAILED DESCRIPTION OF THE DRAWINGS

Figure 2:
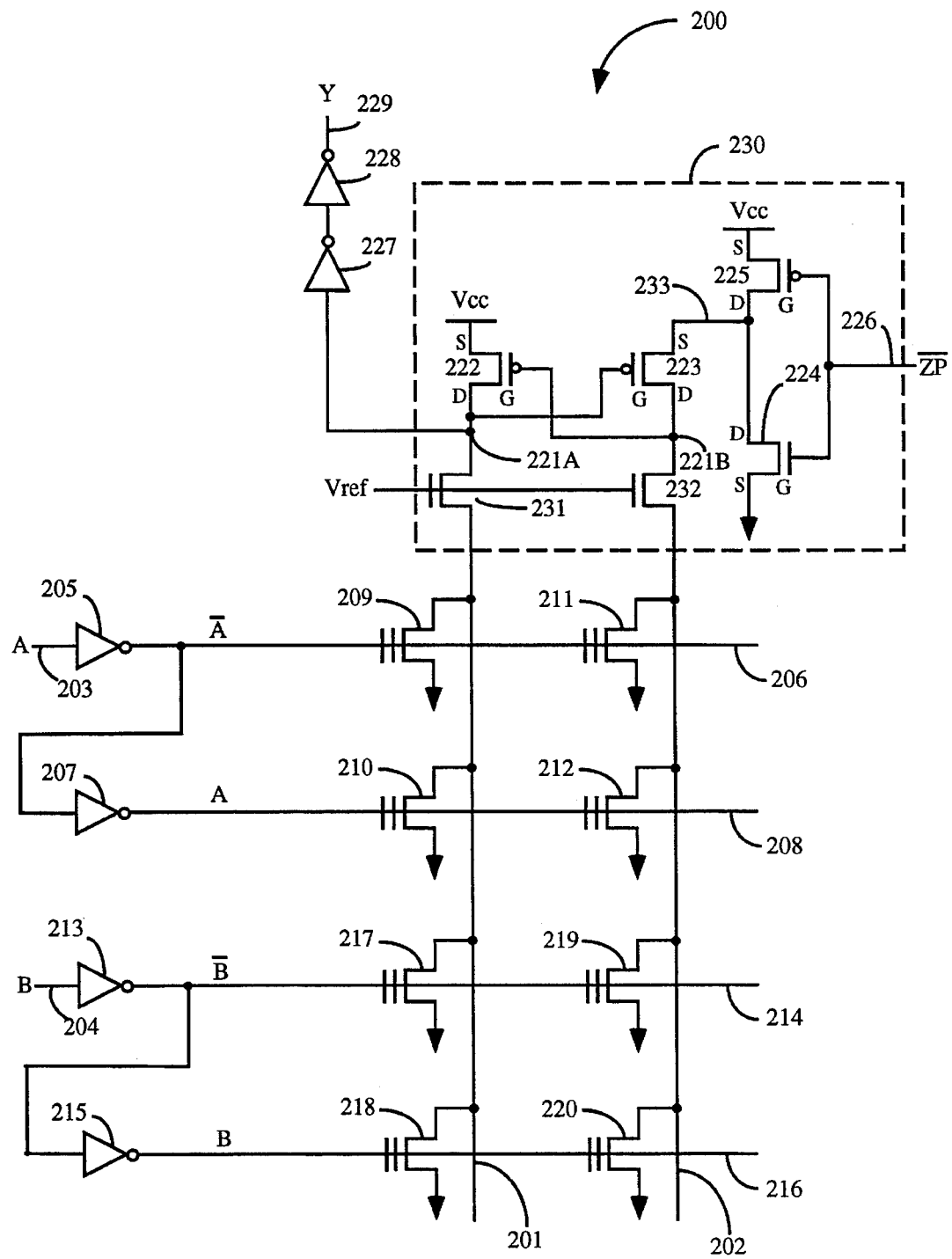
FIG. 2 illustrates a sense circuit in accordance with the present invention that selectively provides a wide AND gate function or a zero power single input function.

Referring to FIG. 2, signals A and B are provided to input lines 203 and 204, respectively. Signal A is inverted by inverter 205 and then provided to the control gates of memory cells 209 and 211 via line 206. The complement of signal A, signal $\overline{A}$, is inverted by inverter 207 and then provided to the control gates of memory cells 210 and 212 via line 208. In a similar manner, signal B is inverted by inverter 213 and then provided to the control gates of memory cells 217 and 219 via line 214, and the complement of signal B, signal $\overline{B}$, is inverted by inverter 215 and then provided to the control gates of memory cells 218 and 220 via line 216. Each of memory cells 209, 210, 217, and 218 is coupled between a low voltage source, i.e. ground, and a bit line 201. Similarly, each of memory cells 211, 212, 219, and 220 is coupled between ground and a bit line 202.

Sense circuit 200 in accordance with the present invention includes selection circuitry 230. As explained in detail below, an enable signal provided to selection circuitry 230 determines whether sensing circuit 200 is in a zero power single input function mode or in a conventional wide AND gate mode. In this embodiment, selection circuitry 230 includes a p-type transistor 222 having its drain D coupled to node 221A of bit line 201, its source S coupled to a high voltage source Vcc (typically 5 volts), and its gate G coupled to node 221B of bit line 202, and a p-type transistor 223 having its drain D coupled to node 221B of bit line 202 and its gate G coupled to node 221A of bit line 201.

Selection circuitry 230 further includes an enable line 226 coupled to the gates G of a p-type transistor 225 and an n-type transistor 224. The source S of transistor 225 is coupled to voltage source Vcc whereas its drain D is coupled to the source S of transistor 223. The source S of transistor 224 is coupled to the low voltage source, in this embodiment ground, whereas its drain D is coupled to the source S of transistor 223. Thus, if a high signal is provided on enable line 226, transistor 224 turns on and transistor 225 turns off, thereby providing a low voltage to the sourse S of transistor 223. On the other hand, if a low signal is provided on enable line 226, transistor 225 turns on and transistor 224 turns off, thereby providing a high voltage to the source S of transistor 223.

In this embodiment of the present invention, selection circuitry 230 further includes an n-type transistor 231 coupled between node 221A and bit line 201 and another n-type transistor 232 coupled between node 221B and bit line 202. Transistors 231 and 232, which are always on due to a reference voltage Vref, limit the voltage swings on bit lines 201 and 202, respectively, to between approximately zero volts and 1.8 volts.

If no wide fanin capability is needed, the zero power single input function mode is activated by providing a low enable signal $\overline{ZP}$ to enable line 226, thereby providing a high voltage to the source S of transistor 223. In accordance with the present invention in the zero power single input function mode, only one memory cell on each of bit lines 201 and 202 is left unprogrammed. For example, if the desired function is Y=A, the memory cell on bit line 201 which is controlled by the inverted polarity of the input signal is left unprogrammed and the memory cell on bit line 202 which is controlled by the true polarity of the input signal is also left unprogrammed. Thus, memory cells 209 and 212 (coupled to bit lines 201 and 202, respectively) are left unprogrammed.

Under these programming conditions, if signal A is high, only unprogrammed memory cell 212 turns on, thereby pulling the voltage on bit line 202 and node 221B low through conducting transistor 232. The low voltage on node 221B, provided to the gate G of transistor 222, turns on transistor 222, which in turn transfers a high voltage to node 221A and bit line 201. This high voltage on node 221A, provided to the gate G of transistor 223, turns off this transistor. The high voltage on node 221A, amplified by inverters 227 and 228, is thus also provided on output line 229. Therefore, output signal Y is high as desired. Note that if transistor 222 is on, no memory cells on bit line 201 are on, thereby ensuring no DC current is drawn through those memory cells. Similarly, because transistor 223 is turned off, no DC current is drawn through this device either.

Figure 1:
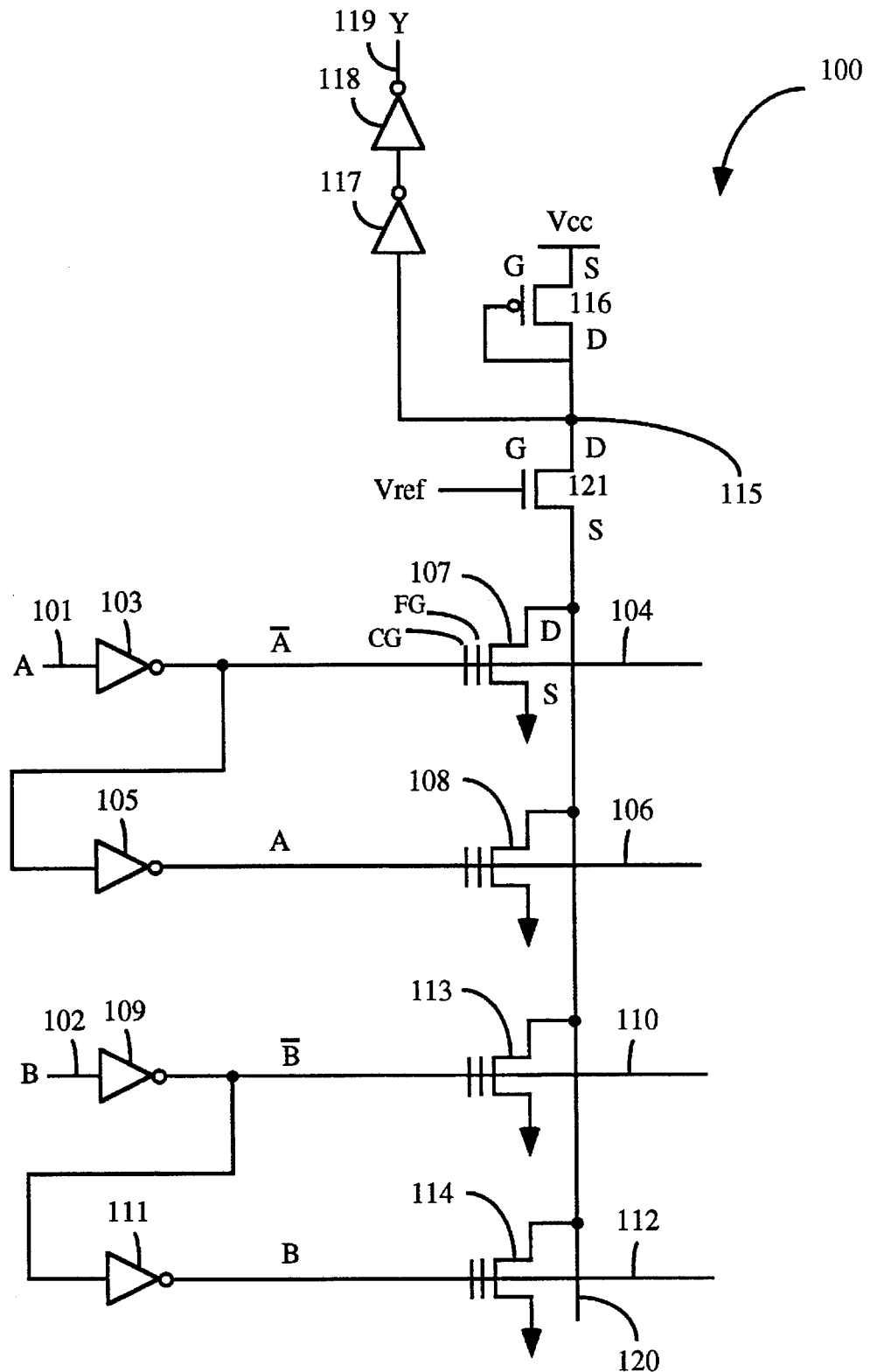
FIG. 1 illustrates a conventional, programmable logic device sense circuit that draws a continuous DC current.

In contrast, if signal A is low, only unprogrammed memory cell 209 turns on, thereby pulling the voltage on bit line 201 and node 221A low through conducting transistor 231. This low voltage on node 221A turns on transistor 223, thereby transferring a high voltage (provided by conducting transistor 225) to node 221B and bit line 202. This high voltage on node 221B, provided to the gate G of transistor 222, turns off transistor 222. The low voltage on node 221A, amplified by inverters 227 and 228, is thus also provided on output line 229. Therefore, output signal Y is low as desired. Note that if transistor 223 is on, no memory cells on bit line 202 are on, thereby ensuring no DC current is drawn through those memory cells. Similarly, because transistor 222 is turned off, no DC current is drawn through this device either. Thus, the present invention provides a mode in which power consumption is significantly reduced compared to prior art sense circuit 100 (FIG. 1) which requires a continuous DC current draw.

Note that the zero power mode may be used to invert a signal as well. For example, if the desired function is Y= $\overline{A}$, the two memory cells controlled by the true polarity on bit line 201 and by the inverted polarity on bit line 202, i.e. memory cells 210 and 211, are left unprogrammed. The operation of sense circuit 200 is similar to the above described Y=A case.

To activate a conventional, wide AND gate function mode in sense circuit 200, a high signal $\overline{ZP}$ is provided to enable line 226, thereby turning on transistor 224 and turning off transistor 225. Thus, a low voltage is provided to the source S of transistor 223. In accordance with this mode, all memory cells on bit line 202 are left unprogrammed. Because complementary signals are provided to the control gates of the memory cells coupled to bit line 202 (for example, memory cells 211 and 212), half of the memory cells on bit line 202 are on, thereby pulling the voltage on bit line 202 and thus node 221B low. This stable low voltage turns on transistor 222 which in turn transfers a high voltage to node 221A. This high voltage, provided to the gate G of transistor 223, turns off transistor 223.

Thus, a high voltage is provided on node 221A in the absence of any active pull down on bit line 201. Specifically, in this embodiment of the present invention, transistor 222 is sized such that it is overpowered by any conducting memory cell on bit line 201. Thus, the value of output signal Y is dependent on the state, i.e. the programmed or unprogrammed state, of the memory cells coupled to bit line 201. In this configuration, the operation of sense circuit 200 is similar to the operation of sense circuit 100 (FIG. 1) and therefore is not described in detail.

The above-described embodiment of the present invention is illustrative only and not limiting. For example, although FIG. 2 indicates that either EPROM or EEPROM cells are used for the memory cells, other technologies, including but not limited to antifuse and SRAM technologies, are used in other embodiments. Moreover, in other embodiments of the present invention, if the memory cells provide a pull-up operation (in contrast to the pull-down operation shown in FIG. 2), then transistors 222 and 225 provide a pull-down function (in contrast to the pull-up operation shown in FIG. 2). Other embodiments of the present invention will be apparent to those skilled in the art. The present invention is set forth in the appended claims.

We claim:

1. A sense circuit comprising:

a first bit line;

a second bit line:

a first input line:

a second input line;

a first plurality of memory cells coupled to said first bit line;

a second plurality of memory cells coupled to said second bit line, wherein a first input signal on said first input line is provided to a first memory cell on said first bit line and a first memory cell on said second bit line, wherein an inverted signal of said first input signal is provided to a second memory cell on said first bit line and a second memory cell on said second bit line, wherein a second input signal on said second input line is provided to a third memory cell on said first bit line and a third memory cell on said second bit line, wherein an inverted signal of said second input signal is provided to a fourth memory cell on said first bit line and a fourth memory cell on said second bit line; and selection circuitry coupled between said first bit line and said second bit line, wherein a first signal provided to said selection circuitry allows said sense circuit to provide a wide AND gate function mode and a second signal provided to said selection circuitry allows said sense circuit to provide a zero power single input function mode.

2. The sense circuit of claim 1 wherein said selection circuitry includes a first transistor and a second transistor, each transistor having a source, a drain, and a gate, wherein said first transistor and said second transistor are each coupled to said first bit line and said second bit line.

3. The sense circuit of claim 2 wherein the drain of said first transistor is coupled to said first bit line, the gate of said first transistor is coupled to said second bit line, and the source of said first transistor is coupled to a first voltage source.

4. A sense circuit comprising:

a first bit line;

a second bit line:

a first plurality of memory cells coupled to said first bit line;

a second plurality of memory cells coupled to said second bit line; and selection circuitry coupled between said first bit line and said second bit line, wherein a first signal provided to said selection circuitry allows said sense circuit to provide a wide AND gate function mode and a second signal provided to said selection circuitry allows said sense circuit to provide a zero power single input function mode, wherein said selection circuitry includes a first transistor and a second transistor, each transistor having a source, a drain, and a gate, wherein said first transistor and said second transistor are each coupled to said first bit line and said second bit line, wherein the drain of said first transistor is coupled to said first bit line, the gate of said first transistor is coupled to said second bit line, and the source of said first transistor is coupled to a first voltage, wherein the drain of said second transistor is coupled to said second bit line, the gate of said second transistor is coupled to said first bit line, and the source of said second transistor is coupled to a means for providing said first voltage source or a second voltage source.

5. The sense circuit of claim 4 wherein said means for providing includes a third transistor and a fourth transistor, each transistor having a source, a drain, and a gate, wherein the drain of said third transistor is coupled to said source of said second transistor and the source of said third transistor is coupled to said first voltage source.

6. The sense circuit of claim 5 wherein the drain of said fourth transistor is coupled to said source of said second transistor and the source of said fourth transistor is coupled to said second voltage source.

7. The sense circuit of claim 6 wherein the gates of said third transistor and said fourth transistor are coupled to an enable line.

8. The sense circuit of claim 7 further including a fifth transistor and a sixth transistor, wherein said fifth transistor is coupled between said first transistor and said first bit line and said fifth transistor is coupled between said second transistor and said second bit line.

9. The sense circuit of claim 1 wherein, in said zero power single input function mode, a first predetermined memory cell coupled to said first bit line and a second predetermined memory cell coupled to said second bit line are left unprogrammed to provide a true polarity of an input signal as an output signal of said sense circuit, wherein said first predetermined memory cell is controlled by the inverted polarity of said input signal and said second predetermined memory cell is controlled by said true polarity of said input signal.

10. The sense circuit of claim 1 wherein, in said zero power single input function mode, a first predetermined memory cell coupled to said first bit line and a second predetermined memory cell coupled to said second bit line are left unprogrammed to provide an inverted polarity of an input signal as an output signal of said sense circuit, wherein said first predetermined memory cell is controlled by the true polarity of said input signal and said second predetermined memory cell is controlled by said inverted polarity of said input signal.

11. A sense circuit comprising:

first programmable means for receiving a plurality of signals;

second programmable means for receiving the complements of said plurality of signals;

a first bit line coupled to predetermined ones of said first and second programmable means;

a second bit line coupled to predetermined ones of said first and second programmable means; and a first input line;

a second input line, wherein a first input signal on said first input line is provided to a first programmable means on said first bit line and a first programmable means on said second bit line, wherein an inverted signal of said first input signal is provided to a second programmable means on said first bit line and a second programmable means on said second bit line, wherein a second input signal on said second input line is provided to a third programmable means on said first bit line and a third programmable means on said second bit line, wherein an inverted signal of said second input signal is provided to a fourth programmable means on said first bit line and a fourth programmable means on said second bit line;

selection circuitry coupled to said first and second bit lines, wherein if said selection circuit receives a first signal, then said sense circuit operates in an AND gate function mode, and wherein if said selection circuitry receives a second signal, then said sense circuit operates in a zero power single input function mode.

12. A sense circuit having two modes, a zero power mode for providing a function of a single input signal and an active pull mode for providing a function of a plurality of input signals, said sense circuit comprising:

a first bit line;

a second bit line;

a plurality of input lines for providing input signals, each input line including:

a first memory device for pulling said first bit line to a first voltage in response to an input signal on said input line;

a second memory device for pulling said first bit line to said first voltage in response to the complement of said input signal on said input line;

a third memory device for pulling said second bit line to said first voltage in response to said input signal on said input line;

a fourth memory device for pulling said second bit line to said first voltage in response to the complement of said input signal on said input line;

means for pulling said first bit line to a second voltage in response to the voltage on said second bit line;

means for pulling said second bit line to either said first voltage or said second voltage in response to the voltage on said first bit line; and means for providing said first voltage or said second voltage to said means for pulling said second bit line.

13. A method of minimizing power in a sense circuit including the steps of:

providing a first plurality of programmable devices on a first bit line;

providing a second plurality of programmable devices on a second bit line;

providing a first input signal on a first input line to a first programmable device on said first bit line and a first programmable device on said second bit line;

providing an inverted signal of said first input signal to a second programmable device on said first bit line and a second programmable device on said second bit line;

providing a second input signal on a second input line to a third programmable device on said first bit line and a third programmable device on said second bit line;

providing an inverted signal of said second input signal to a fourth programmable device on said first bit line and a fourth programmable device on said second bit line;

coupling selection circuitry to said first and second bit lines;

providing a signal to said selection circuitry, wherein if said selection circuit receives a first signal, then said sense circuit functions as a conventional AND gate, and wherein if said selection circuitry receives a second signal, then said sense circuit functions as a zero power connection.

* * * * *